United States Patent [19]

Miyabayashi

[11] Patent Number: 5,036,396
[45] Date of Patent: Jul. 30, 1991

[54] SOLID IMAGE-PICKUP DEVICE HAVING STORAGE CELL UNIT

[75] Inventor: Takeshi Miyabayashi, Nagoya, Japan

[73] Assignee: Brother Kogyo Kabushiki Kaisha, Aichi, Japan

[21] Appl. No.: 537,797

[22] Filed: Jun. 14, 1990

[30] Foreign Application Priority Data

| Jun. 19, 1989 | [JP] | Japan | 1-158014 |
| Jun. 19, 1989 | [JP] | Japan | 1-158015 |
| Jun. 19, 1989 | [JP] | Japan | 1-158018 |
| Jun. 19, 1989 | [JP] | Japan | 1-158019 |

[51] Int. Cl.$^5$ .............................................. H04N 3/14
[52] U.S. Cl. .......................... 358/213.11; 358/213.29
[58] Field of Search ..................... 358/213.29, 213.26, 358/213.11, 909

[56] References Cited

U.S. PATENT DOCUMENTS

| 4,853,785 | 8/1989 | Ovshinsky et al. | 358/213.11 |
| 4,884,143 | 11/1989 | Uya | 358/213.29 |
| 4,907,088 | 3/1990 | Cannella et al. | 358/213.11 |

Primary Examiner—Stephen Brinich
Attorney, Agent, or Firm—Oliff & Berridge

[57] ABSTRACT

A solid image-pickup device for converting an optical image of an object into a corresponding electric charge image and reproducing the image of the basis of the corresponding electric charge image, including a solid image-pickup device having a number of photoelectric conversion units each having a light receiving surface for converting an optical image of an object incident thereto into an electrical signal representing a light amount of the incident optical image, and a number of storage cell units each for storing charges in accordance with the electrical signal, to thereby form and store therein an electric charge image corresponding to the optical image, the photoelectric conversion units and the storage cell units being arranged in a matrix form and each of the photoelectric conversion units being laminated on each of said storage cell units, and a charge image detecting unit for optically or electrically reading out the electrical charge signal stored in the solid image-pickup device to reproduce the optical image.

16 Claims, 13 Drawing Sheets

INFRARED SPECTRUM OF $Li_xV_2O_5$
A:x=0, B:x=0.11, C:x=0.22, D:x=0.32, E:x=0.44

INFRARED SPECTRUM OF $Li_xV_2O_{17}$
A:x=0, B:x=0.37, C:x=0.53, D:x=0.60, E:x=0.82

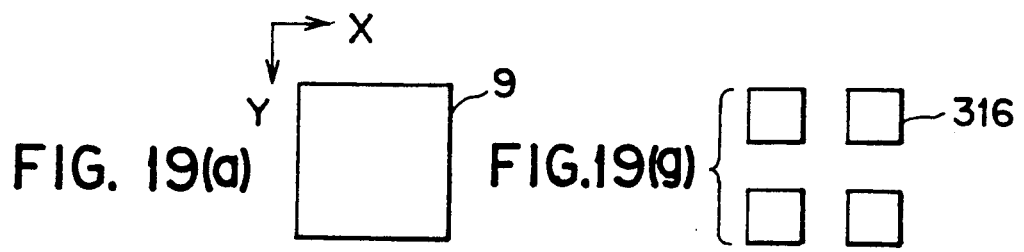
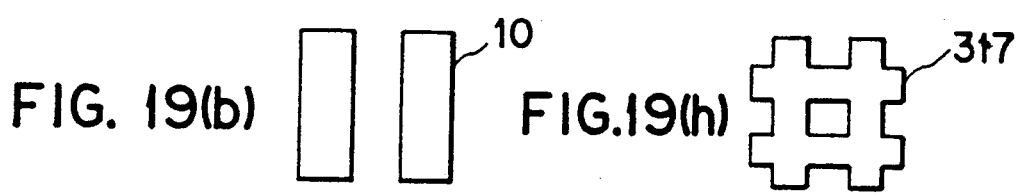
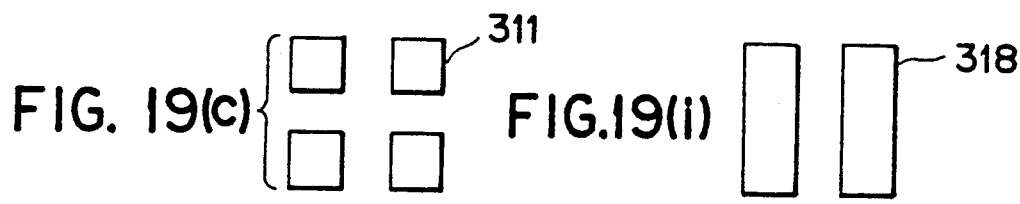
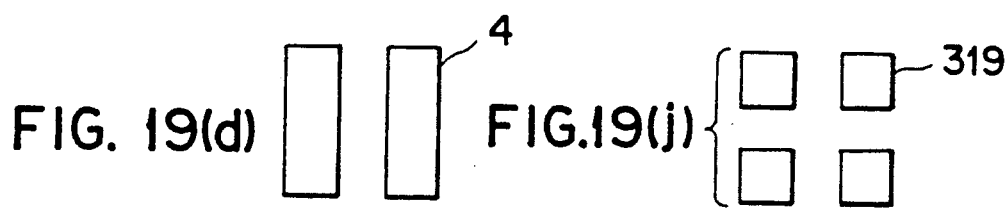
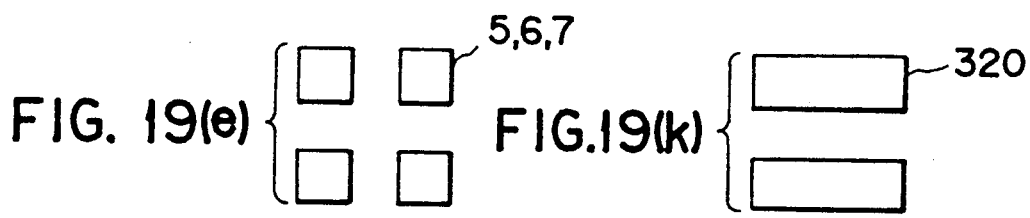
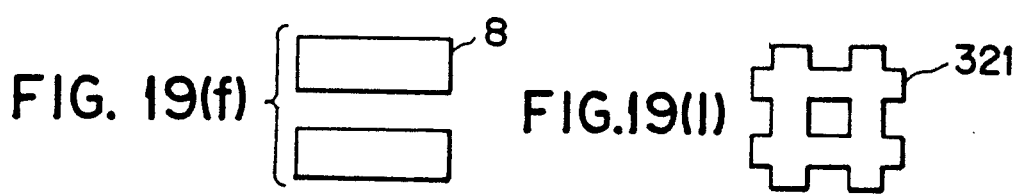
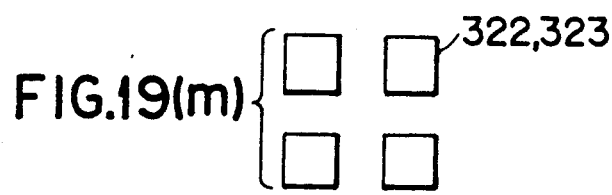

SOLID IMAGE-PICKUP DEVICE HAVING STORAGE CELL UNIT

BACKGROUND OF THE INVENTION

The present invention relates to a solid image-pickup device, and more particularly to a solid image-pickup device using a storage cell in which an electrical image corresponding to an original image is beforehand produced and stored in the storage cell, and then the original image is reproduced on the basis of the electrical image.

A charge coupled device (CCD) has been conventionally and widely utilized in a solid image-pickup device for forming an image on the basis of an image light incident thereto. The CCD is a device having a semiconductor array for transferring an electric charge signal generated by an incident light image in synchronism with a transfer signal.

In the CCD thus constructed, a transferring efficiency for the electric charge signal is remarkably variable in accordance with a surface level density, configuration and various operational conditions of the CCD. Therefore, a severe supervision for operational conditions is required in order to accurately converting an incident optical information into an electric signal. Further, the CCD is not capable of holding a sufficient amount of surface electrical charges, and thus it would be almost impossible for the CCD to have a storage function for conducting a work on external elements Still further, the CCD requires an intricate charge-transfer circuit for transferring the electrical charges therealong, which imposes restrictions on miniaturization of the whole construction of the CCD, so that it would be almost impossible to provide a CCD having large area and high density. In view of the above disadvantages of the conventional solid image-pickup device having a CCD, a solid image pick-up device capable of overcoming the disadvantages as described above has been demanded.

SUMMARY OF THE INVENTION

It is therefore, an object of the present invention to provide an improved solid image-pickup providing provide an improved solid image-pickup providing each picture element with a sufficient storage function for storing a sufficient amount of charges in accordance with an incident light image and accurately detecting the amount of the stored charges to thereby accurately reproduce an original image.

In order to attain the above object, a solid image-pickup device according to this invention in which an optical image of an object is converted into a corresponding electric charge image and and the image is reproduced on the basis of the corresponding electric charge image comprises a solid image-pickup device having a number of photoelectric conversion units each having a light receiving surface for converting an optical image of an object incident thereto into an electrical signal representing a light amount of the incident optical image, and a number of storage cell units each for storing charges in accordance with the electrical signal, to thereby form and store therein an electric charge image corresponding to the optical image, the photoelectric conversion units and the storage cell units being arranged in a matrix form and each of the photoelectric conversion units being laminated on each of the storage cell units, and a charge image detecting unit for optically or electrically reading out the electrical charge signal stored in the solid image-pickup device to reproduce the optical image.

In the solid image-pickup device thus constructed, each of the storage cell units comprises a positive electrode, a solid electrolyte and a negative electrode, and each of the photoelectric conversion units comprises a photoswitch having a transparent electrode and a photoconductive layer or a p-i-n type photoelectric transducer comprising a surface electrode, a p-type semiconductor layer, an i-type semiconductor layer and an n-type semiconductor layer.

When the photoswitch is used as the photoelectric conversion unit, the solid image-pickup device is further provided with a charging unit for charging each of the storage cell units at a predetermined value. In this case, the photoswitch discharges the amount of charges corresponding to the amount of the incident optical image therethrough from the storage cell units to thereby form the optical latent image with charges remaining in the storage cell units.

In place of the photoswitch or the p-i-n type photoelectric transducer, a material having an intercalation function may be used as the photoelectric conversion unit. In this case, the material is used as a positive electrode of each of the storage cell units. Further, when the material having the intercalation function has a light absorbing characteristic variable between charging and discharging states of the storage cell units, the electric charge image can be stored as a change distribution in the light absorbing characteristic of the positive electrodes of the storage cell units. In this case, the electrical charge image stored in the storage cell units can be optically read out by irradiating a laser beam to the positive electrode and detecting the reflected light therefrom.

Further, a toner spray gun for electrically supplying toners to the storage cell units may be used to develop the electric charge image stored in the storage cell units into a toner image through a discharging operation of the storage cell units.

BRIEF DESCRIPTION OF THE DRAWINGS

In the drawings;

FIGS. 19(a) through 19(m) show configurations of various layers constituting the solid image-pickup device of the fourth embodiment;

DETAILED DESCRIPTION OF THE PREFERRED EMBODIMENTS

Preferred embodiments of this invention will be described hereunder with reference to the accompanying drawings.

A solid image-pickup device according to this invention basically comprises two units, one of which is a photoelectric conversion element having a light receiving surface for converting an incident light image into a corresponding electrical signal, and the other of which is a storage cell unit for storing the electrical signals produced in the photoelectric conversion unit. In the solid image-pickup device, an original image is optically supplied to the photoelectric conversion unit to be converted into the corresponding electrical signal, and then is stored in the storage cell unit in a sufficient amount of charges Accordingly, the solid image-pickup device of this invention is capable of producing and storing the electrical signal corresponding to the original image, which can provide external elements to various works such as a copying operation using toners, an optical image reading operation and other image reproducing operations.

Figure 1:
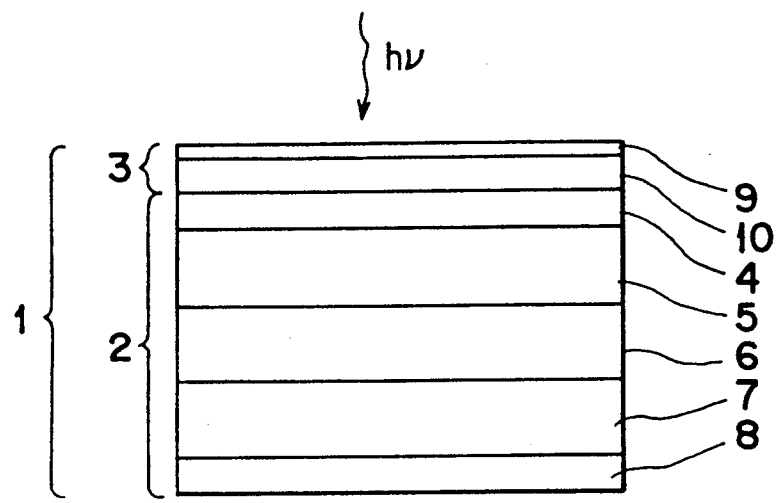
FIG. 1 is a cross-sectional view of a first embodiment of the solid image-pickup device according to this invention.

FIG. 1 shows a first embodiment of the solid image-pickup unit of this invention. In this embodiment, the photoelectric conversion unit comprises a photoconductive layer serving a photoswitch or a discharging switch.

The solid image-pickup unit as shown in FIG. 1 comprises a sheet type storage cell unit and a photoelectric conversion unit 3 serving as a photoswitch or a discharging switch provided on the storage cell unit 2. The storage cell 2 of this embodiment comprises a positive electrode collector 4 formed of Ni or the like, a positive electrode formed of $V_6O_{13}$, $V_2O_5$ or the like, a solid electrolyte 6 such as polymer electrolyte comprising a polyethylene derivative containing $LiC_4$, a negative electrode 7 formed of Li-Al alloy and a negative electrode collector 8 formed of Ni or the like. On the other hand, the photoelectric conversion element 3 comprises a transparent electrode 9 formed of ITO (Indium Tin Oxide) film or the like, a photoconductive layer 10 formed of $TiO_2$, ZnO, an organic photoconductive material or the like. In this embodiment, the photoelectric conversion element 3 is provided on the positive electrode collector 4, however, it may be provided on the negative electrode collector 8.

Figure 2:
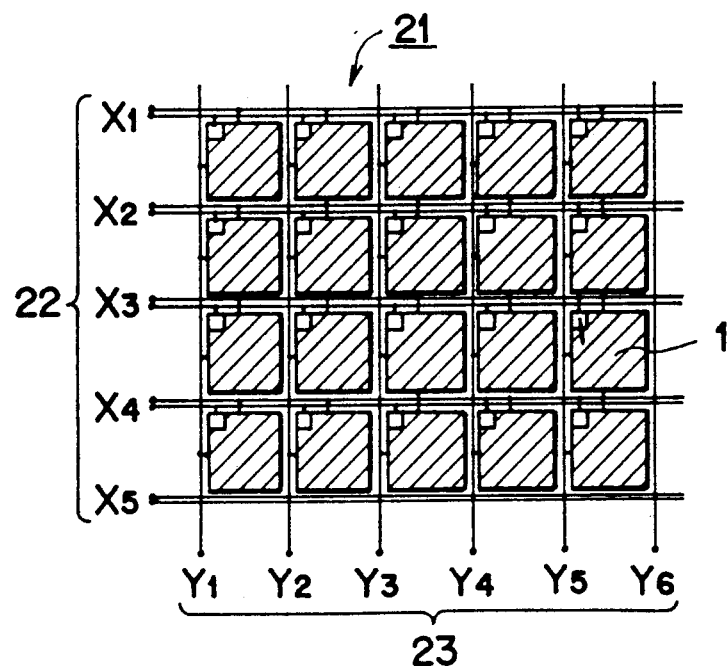
FIG. 2 shows a matrix arrangement of the solid image-pickup units and outgoing electrodes which constitutes the solid image-pickup device.
Figure 3:
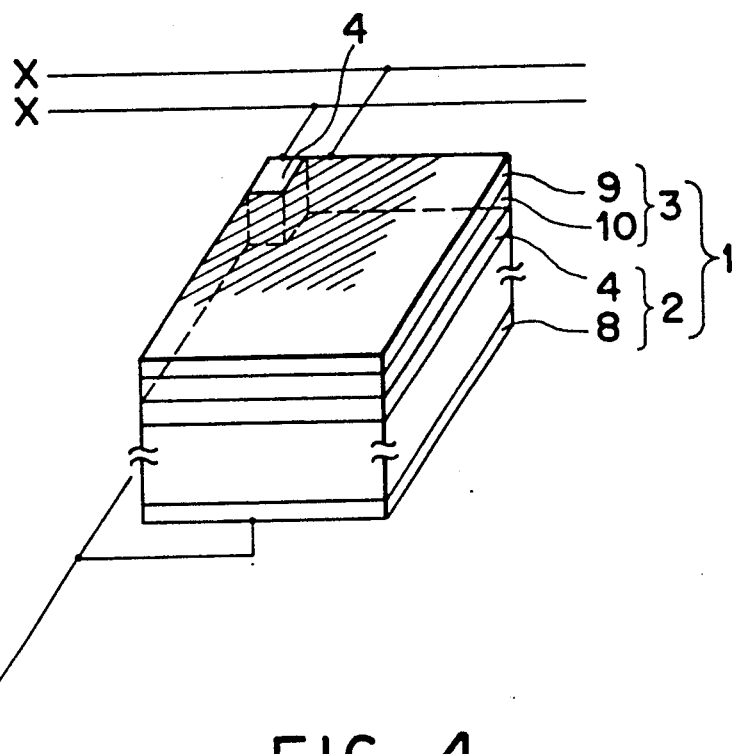
FIG. 3 shows a wiring arrangement of the outgoing electrodes provided to the solid image-pickup device as shown in 2.

FIG. 2 is a top view of the solid image-pickup device 21 using a number of solid image-pickup units as shown in FIG. 1, which are arranged in a matrix form, and outgoing electrodes X and Y, which are arranged in a matrix form in the solid image-pickup device, FIG. 3 is a schematic view for showing the arrangement of the outgoing electrodes provided for the solid image-pickup device and FIG. 3 is an explanatory view of the solid image-pickup device for showing an operation of thereof.

The outgoing electrodes X comprises two groups of outgoing electrodes, the outgoing electrodes of one group being connected to the transparent electrodes 9 of the photoelectric conversion elements 3 and those of the other group being connected to the positive electrode collectors 4 of the storage cell elements 2, and the outgoing electrodes Y are connected to the negative electrode collectors of the storage cell units 8. The outgoing electrodes X and Y have a wiring arrangement in which the outgoing electrodes X and Y are provided between the neighboring solid image-pickup units horizontally and vertically (in the X-direction and Y-direction), respectively. The transparent electrodes 9 of the photoelectric conversion units are connected to the negative electrode collectors 8 of the storage cell units 2 through a resistor 35 for discharging an amount of charges corresponding to the intensity of an incident image light from the storage cell units 2 when the image light is supplied, and the positive and negative electrode collectors and 8 of the storage cell units are connected to each other through a controller 30 for charging the storage cell units 2 before the light image is supplied to the solid image-pickup device, reading out the charges remaining in the storage cell units and writing the charges in the storage cell units in accordance with input information.

The controller 30 comprises a power source 32, resistor 34 and switches 31 and 33. In the controller 30 thus constructed, the power source 32 and the switch 31 are connected in series between the positive electrode collectors 4 and the negative electrode collectors 8 of the storage cell units 2 and serves as a charging circuit for charging the storage cell units 2, while the resistor 34 and the switch 33 are connected in series between the positive electrode collectors 4 and the negative electrode collectors 8 and serves as a read-out circuit for reading out a charge amount stored in each storage cell unit 2. The resistor (load) 34 is used to detect the remaining charges in each storage cell unit 2 after the image light is supplied to the solid image-pickup device 21, that is, to convert the electrical signal stored in the storage cell units 2 into a bit map information by measuring a discharging current with an external detecting means (not shown).

Further, the discharging resistor 35 serves as a discharging circuit during a light-exposure process and is connected between the transparent electrodes 9 of the photoelectric conversion units 3 and the negative electrode collectors 8 of the storage cell units 2.

The switches 31 and 33 are designed so that a matrix scanning operation can be carried out for the outgoing electrodes X extending in the X-direction and the outgoing electrodes Y extending in the Y-direction. A shift register may be used as these switches.

Figure 4:
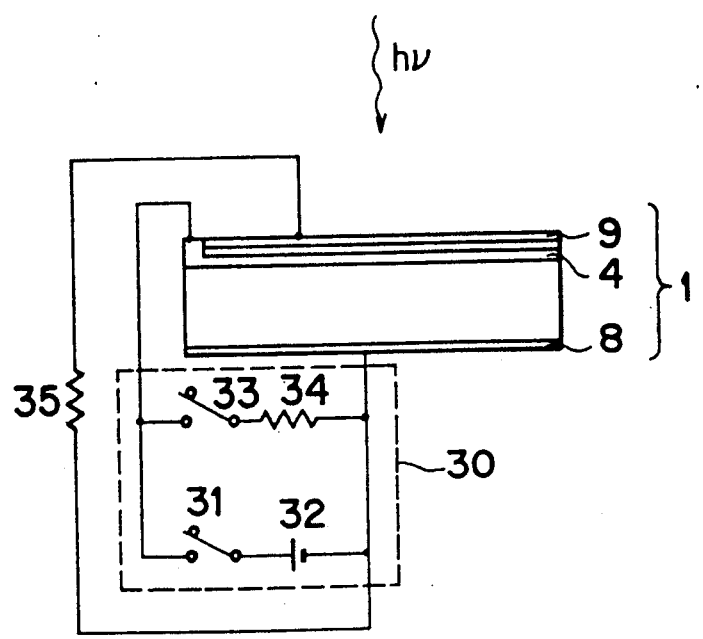
FIG. 4 shows the solid image pickup device including a circuit arrangement charging and discharging circuits.

An operation of the image forming apparatus as shown in FIG. 4 will be described hereunder.

At a first stage, the switch 31 of the controller 30 is kept at an ON-state for a predetermined period to store a predetermined amount of electric energy (charges) in each sheet type storage cell unit 2 through the power source 32 which is preferably a constant-current source. At a next stage, light hν is irradiated through the transparent electrode 9 to the photoconductive layer 10 to switch the photoelectric conversion units serving as the discharging switch 3 to ON-state, so that the charged stored in the storage cell units 2 are discharged therefrom through the transparent electrode 9 and the resistor 35 in accordance with an irradiated light amount and a irradiating time of the light. As a result, a charging distribution corresponding to an incident light image is formed as an optical latent image in the storage cell units 2.

At a next stage, the switch 33 is switched to ON-state to allow a discharging current to flow from the storage cell units 2 through the resistor 34. The discharging current flowing through the resistor 34 is measured to detect residual charges which have been stored in each storage cell unit 2, that is, the optical latent image stored in the storage cell units 2 is read out as a bit map information, and then the bit map information is used for various operations of the external elements.

For example, the bit map information may be subjected to an editorial operation such as reduction, enlargement, correction or other operations, and then an editorially modified latent image is stored in the storage cell units 2 again on the basis of the modified bit map information through the power source 32, that is, the incident image light can be editorially modified through a conversion operation of the latent image into the bit map information.

If a toner spray gun for electrically supplying toners is further provided to the solid image-pickup device so as to confront the negative electrode collectors 8 of the storage cell units 2, and one end of the spray gun is electrically connected to a contact point of the power source 32 and the resistor 34, the optical latent image electrically stored in the storage cell units 2 can be developed with the toners.

Further, if an intensity distribution of signals (charge distribution stored in the storage cell elements) read out of the storage cell units 2 is converted to an two-dimensional image, and inputted to an external means (not shown) such as a display unit, an incident light image (hν) to the solid image-pickup device can be traced.

In the first embodiment of the solid image-pickup device as described above, the photoelectric conversion unit comprises a transparent electrode and a photoconductive layer and the electrical signal corresponding to the incident image light is based on a photoswitching or photoconductive operation of the photoconductive layer. Further, the solid image-pickup device as described above utilizes an electrical read-out circuit to read out the latent image stored in the storage cell units. However, the photoelectric conversion unit and the read-out manner of this invention are not limited to these elements of the first embodiment. For example, an optical read-out manner as described below can be applied to this invention.

Figure 5:
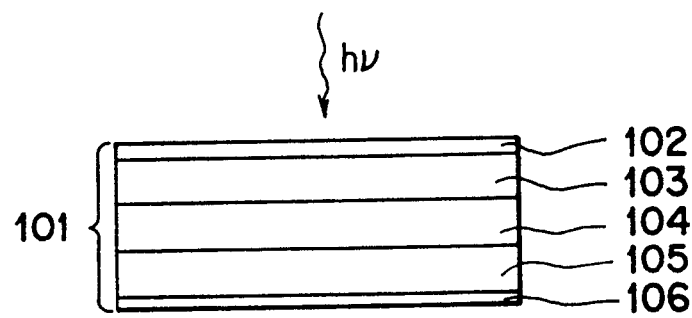
FIG. 5 is a cross-sectional view of a second embodiment of the solid image-pickup unit according to this invention.

FIG. 5 shows a second embodiment of the solid image-pickup device according to this invention.

Figure 6:
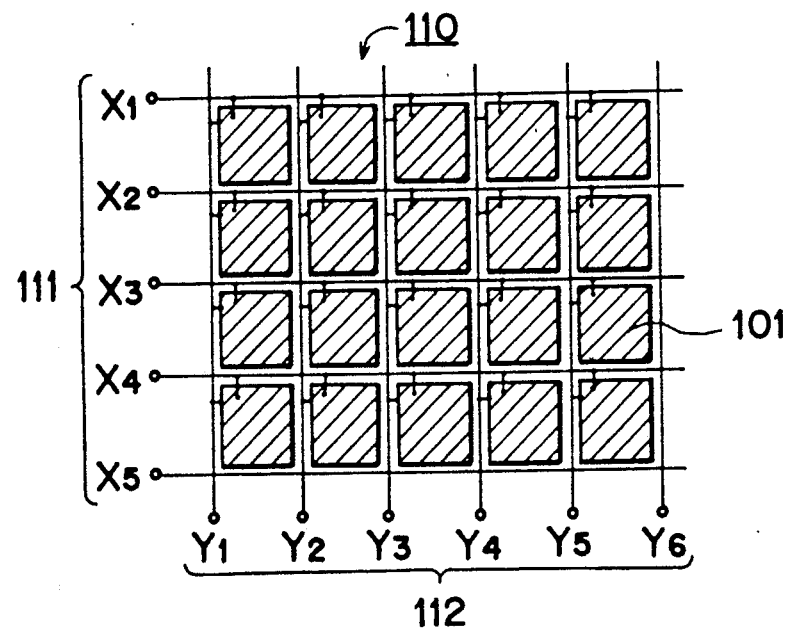
FIG. 6 is a plan view showing a matrix arrangement of a number of solid image-pickup units as shown in FIG. 5 used in the solid image pick-up device according to this invention.

The image pick-up device of this embodiment includes a number of sheet type storage cell units 101 arrayed in a matrix from as shown in FIG. 6. Each of the storage cell units 101 includes, as shown in FIG. 5, a transparent positive collector 102 as one surface layer of the unit, an positive electrode layer 103 which is positioned immediately below he collector 102 and has an optical intercalation function, a solid electrolyte 104 positioned immediately below the positive electrode layer 103, a negative electrode 5 formed of Li-Al alloy and positioned immediately below the solid electrolyte 104, and a negative electrode collector 106 positioned immediately below the negative electrode 105 and serving as another surface layer of the unit.

In this embodiment, the photoconductive layer as described above is not used, and in place of the photoconductive layer, a material having an intercalating function is used as a positive electrode 103 having a function of converting the incident image light into the corresponding electrical signal for each storage cell unit, The material of the positive electrode layer 103 provided with the intercalating function is selected from the group consisting of $ZrSe_2$, $HfSe_2$, $ZrS_2$, $HfS_2$, $FePS_3$, $InSe$, $TiO_2$, $Cu_3PS_4$, $Cu_{6-x}PS_5I$, and $(CH)n$. The material of the electrolyte layer 104 is preferably a polymer electrolyte such as a polyethylene group in which cations such as lithium ion, natrium ion and copper ion are containable. Material of the negative electrode collector 106 should preferably have an excellent capability of attracting toner particles, which would improve an image forming ability. To this effect, nickel or nickel alloy is available as the material of the collector 106.

The storage cell units 101 each serving as a picture element 101 are arranged in a matrix form and constitutes a solid image-pickup device 110 as shown in FIG. 6. Each of the storage cell units 101 is connected to two groups of outgoing electrodes 111 and 112 which are arranged horizontally and vertically (in X and Y directions) so that a matrix scanning is performed for the picture elements. In this case, a monitoring device for monitoring a moving object at high speed is attainable if a shutter (not shown) is provided over the solid image-pickup device 110.

Figure 7:
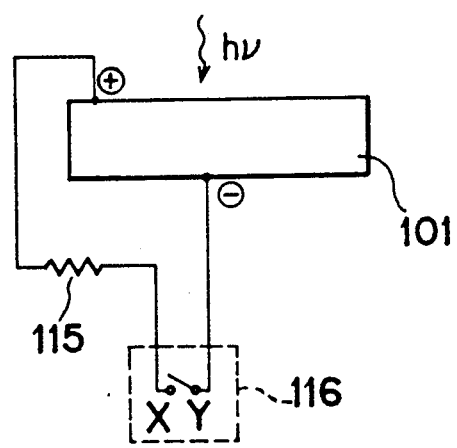
FIG. 7 is a schematic diagram for showing a signal read out circuit for the solid image-pickup device as shown in FIG. 6.

FIG. 7 shows a signal read-out circuit for electrically detect an electrical signal corresponding to an amount of an electrical charge which is stored in each storage cell unit 101 upon light irradiation thereto. The outgoing electrodes X are connected through a resistor 115 and a switch 116 to the outgoing electrodes Y. More specifically, On the basis of an intercalative reaction as described below, optical intercalation occurs in the sheet-type storage cell units 101 by irradiating a light hν thereto. Upon this light irradiation, each of the storage cell units 101 accumulates therein an electric charge whose amount is proportional to the incident light amount. Thereafter, the switch 116 is switched to an ON-state so that the electric charges accumulated in the storage cell units 101 is discharged therefrom, and the discharge current is detected by the resistor (or load) 115. That is, the electric signal corresponding to the electric charge stored in each storage cell unit 101 is obtained through a switching operation of the switch 116. A shift register or the like may be used as the switch 116.

Figure 8A:
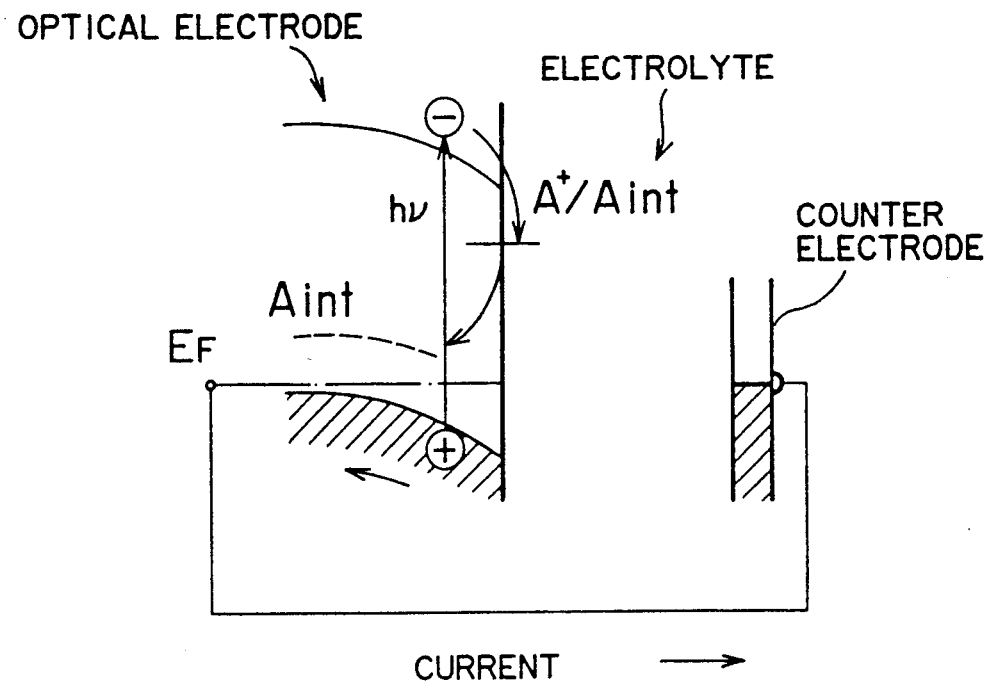
FIGS. 8(A) is an explanatory diagram for explaining an optical intercalative reaction.
Figure 8B:
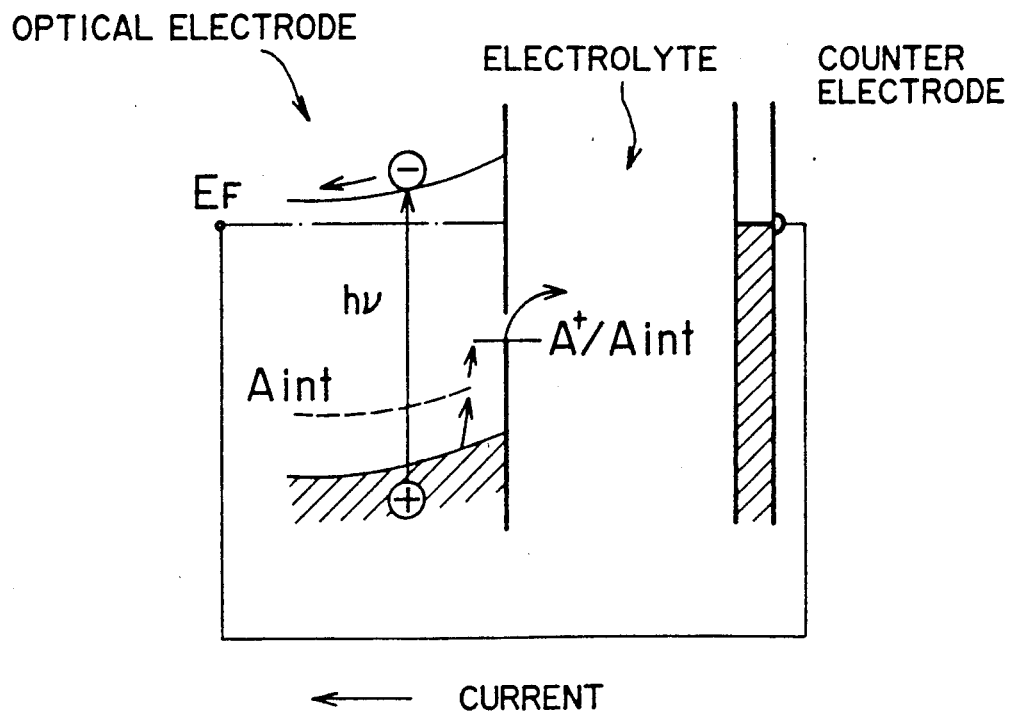
FIG. 8(B) is an explanatory diagram for explaining an optical deintercalative reaction.

The principle of the optical intercalation will be described with reference to FIGS. 8(A) and 8(B).

The intercalative reaction is generally defined as a reaction where a host crystal TyXz traps a guest ion A+ in its crystal lattice by redox reaction, which is carried out in the following equation (1). In this case, lattice constants of the host crystal are increased, that is, the crystal lattice is expanded, however, an essential structure of the crystal is unchanged.

$$xA^+ + xe^- + TyXz \to AxTyXz \quad (1)$$

When a semiconductor is dipped into an electrolyte solution containing guest ions, electrons are moved therebetween until Fermi levels of the semiconductor and the electrolyte become coincident with each other, so that a space charge layer is formed at the surface of the semiconductor. Due to the existence of the surface charge layer at the interface between the semiconductor and the electrolytic solution, an energy band of the semiconductor is upwardly or downwardly bent in accordance with an energy different between the Fermi levels of the semiconductor and the electrolyte solution.

Here, the Fermi level of the electrolytic solution is a redox potential $(A^+/A^-)$ of the guest ion $A^+$ existing largely in amount in the electrolyte solution. As shown in FIG. 8(A), When a P-type semiconductor is used, the energy band of the semiconductor is downwardly bent at the interface between the semiconductor and the electrolytic solution. If a light having energy larger than that of the band gap of the semiconductor is irradiated onto the P-type semiconductor to excite electrons in the valence band, then the electrons in the valence band are transferred to the conduction band, and positive holes remain in the valence band. Since the energy band of the semiconductor is downwardly bent, the positive holes produced in the neighborhood of the interface are moved toward the inner portion of the semiconductor along the curvature of the energy band, and the positive holes produced in the inner portion of the semiconductor do not move toward the interface. That is, the positive holes produced due to the light irradiation are not supplied through the interface to the electrolytic solution, and thus the positive holes are not bonded to the ions of molecules of the electrolytic solution. Rather, the positive holes flow into a counter electrode by way of an external circuit and disappear through an oxidation reaction thereat.

On the other hand, the excited electrons which are transferred to the conduction band move toward the interface along the curvature of the energy band to cause a electrochemical reaction with the electrolytic solution, (particularly guest ions), so that a cathode current is flowed. If a redox level $(A^+/A^0)$ of the guest atom is lower than the level of the conduction band edge of the semiconductor, cation ions $(A^+)$ of the guest atoms are reduced. Generally, by this reducing reaction, gaseous material is generated, or a metal electrocrystallization occurs. However, the generated A atoms can be trapped into the semiconductor if a suitable energy level for trapping the A atoms is provided in a forbidden band of the semiconductor. If the energy level of the guest atom is lower than the Fermi level of the semiconductor, the guest atoms trapped in the semiconductor are stabilizingly retained therein even after the light irradiation is terminated. That is, the intercalation of the A atoms into the P-type semiconductor is performed. This intercalation is carried out by means of light, and thus is particularly named as an optical intercalation. It should be noted that the energy level of the guest atoms has not initially existed, but is provided by the intercalation Whether the reduced material $A^0$ is gasificated or is precipitated as a metal, or the reduced material undergoes the intercalation, is greatly dependent on the state of the guest ion $A^+$ at an instance when electrons are transferred from the electrode to the guest ions $A^+$. The intercalation reaction is carried out by a strong co-reaction between the guest ions $A^+$ and the electrode, and thus the guest ions $A^+$ are considered to form a kind of surface level on the surface of the electrode. This consideration is shown in FIGS. 8(A) and 8(B) where the redox level of the guest atoms extends in both of the solution and the semiconductor.

On the other hand, when an n-type semiconductor is used, it is guessed that there occurs an optical deintercalation where the guest atoms trapped in the lattice are oxidized and dissolved into the solution as cations $A^+$ upon light irradiation. This energy diagram for showing the optical deintercalation is shown in FIG. 8(B). In the n-type semiconductor, since its energy band is upwardly bent at the interface between the semiconductor and the electrolytic solution, only the positive holes in the valence band participate in an electrochemical reaction at the electrode surface, so that anode current is generated. If the level of the guest atoms occupies a suitable position in the forbidden band, the guest atoms receive the positive holes at the electrode surface, and are dissolved into the solution as cations.

The sheet-type storage cell units 101 of this embodiment is provided with the positive electrode layer comprising a material capable of exhibiting the optical intercalation as described above, and are integrally arrayed in two-dimensional or X-Y matrix form as shown in FIG. 6. When a light having an energy larger than the bandgap is applied to the positive electrode layers 103 of the storage cell units 101, electric charges are stored in each of the storage cell units 1 in proportion to the incident light amount. If the switch 16 (shift register) for the matrix scanning operation is switched to an ON-state, the charges stored in the storage cell units can be detected by measuring the discharging current from the storage cell units 101 through the load or the resistor 115. If discharging currents from the storage cell units or the picture elements are successively read out, and an intensity distribution of the discharging currents is two-dimensionally plotted, then an optical image of an object can be traced. Further, by increasing a capacity of each of the storage cell units 101, the electric charges stored in the storage cell units 101 can attract toner particles, so that the storage cell units can directly provide a toner image in the manner as described above.

In addition to the switch 16 shown in FIG. 7, a charging switch different from the switch 16 and a charging circuit may be provided to the solid image-pickup device of the above embodiment. If a part of the storage cell units 101 (for example, the storage cell units positioned at an outer frame portion of an imaging surface of the solid image-pickup device) are charged or discharged by the charging switch and the charging circuit, a white or black image (frame) is partly formed in addition to an image corresponding to an incident light image.

Figure 9:
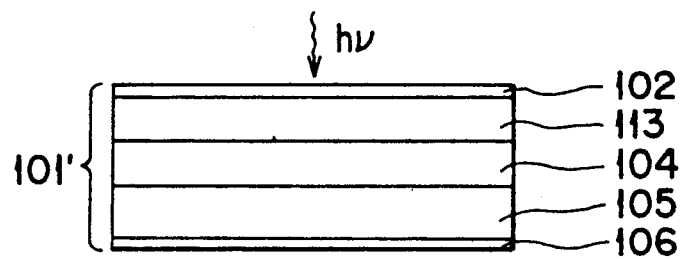
FIG. 9 is a cross-sectional view of a modification to the solid image-pickup device of the second embodiment.

A modification of the solid image-pickup device as described above will next be described with reference to FIGS. 9 through 11, wherein like parts and components are designated by the same reference numerals and characters as those shown in the above embodiment. The sheet-type storage cell unit 101' of this modification as shown in FIG. 9 is substantially the same as that of the above embodiment, except for the material used as a positive electrode layer. That is, the storage cell units 101' in this embodiment has an entire characteristic of that of the above embodiment as shown in FIG. 5. However, the positive electrode layer 113 of the this embodiment is formed of a material in which a light absorbing characteristic such as an absorption spectrum are changed between the times of charging and discharging (or a non-irradiation time of light and an irradiation time of light). The change in the light absorbing characteristic with respect to each of the storage cell units is detected by scanning the positive electrode layer with the laser beam under the condition that the signal holding state (after the light irradiation and prior to the discharge) is maintained unchanged, and the detected signal is successively monitored. As a result, light receiving amount in each of the storage cell units is detectable, so that the solid image-pickup device of this modification also has the same function as described above.

Typical material of the positive electrode layer 113 of this modification is $Cu_{6-x}PS_5I$. This material is of opaque material since lights in the visible range can be absorbed thereinto. However, if optical intercalation occur with respect to copper ion or Ag ion which participates in the charging reaction in the storage cell units, the material has a transparency for red. Further, as a material used for a solid electrolyte layer 104, a polymer electrolyte such as polyethylene group is preferably used in which copper ion and Ag ion are mobile. Further, as a material of a negative electrode layer 105, a thin chip formed of Cu or Ag is available. Moreover, nickel or copper is used as a material of the negative electrode collector 106.

Figure 10:
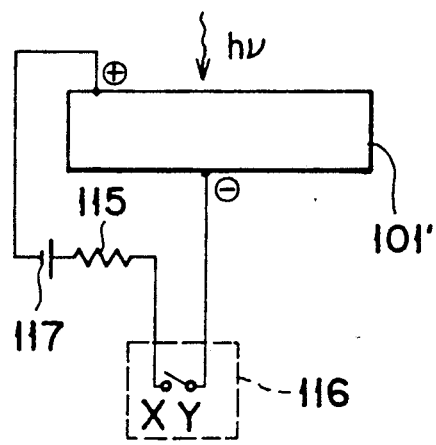
FIG. 10 shows a signal erasing circuit for the solid image-pickup device as shown in FIG. 9.

FIG. 10 shows a circuitry diagram for erasing a charge signal stored in the sheet-type storage cell units 101' as shown in FIG. 9. In this embodiment, prior o the occurrence of the intercalation by the light irradiation, that is, prior to writing an image information in the storage cell units 101', an electrical current is allowed to flow through the resistor 115 and a power source 117 by switching the switch 116 to an On-State in order to break about a deintercalation in the sheet-like storage cell units 101'.

With this arrangement, when a reflection light (visible light) reflected from an object is applied to the storage cell units 101', an electric charge is stored in the units by the intercalative reaction in the storage cell units 101' as described above. Simultaneously, the light absorbing characteristic of the positive electrode layer 113 is changed due to the optical property of the material used as the positive electrode layer 113. In order to monitor the change in the light absorbing characteristic may be used a monitor device as shown in FIG. 11 for optically detecting the change in the light absorbing characteristic of the positive electrode layer 113. In combination of the monitor device as shown in FIG. 11 and the solid image-pickup device as shown in FIGS. 9 and 11, an optical read-out operation for optically reading out an electrical charge signal stored in the storage cell units can be carried out for the solid image-pickup device.

Figure 11:
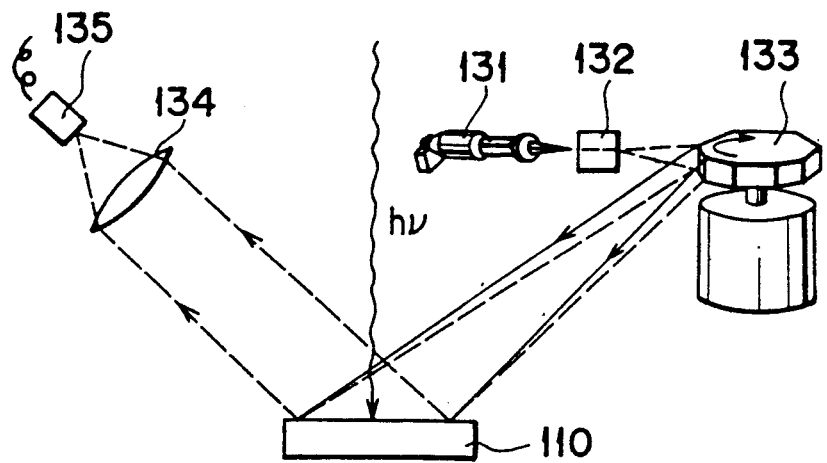
FIG. 11 is a schematic diagram for optically reading out an electric charge image stored in the solid image-pickup device.

The monitor device as shown in FIG. 11 includes a light source 131 for emitting a laser beam used for reading out the electrical charge signal (the change in the light absorbing characteristic), a light deflector 132, a polygon mirror 133 for scanning the surface of the positive electrode layer 113 with the laser beam, a detector 135 for detecting the reflected laser beam, and a condenser lens 134 for focusing the laser beam reflected from the positive electrode layer 113 to the detector 135.

The light source 131 should emit a laser beam having a short frequency, i.e., a wavelength of not less than 650 nm which is nothing to do with the optical intercalation of $Cu_{6-x}PS_5I$. When light is irradiated to the storage cell units, spectral intensity of the light reflected from the positive electrode layer 113 is changed in accordance with the amount of Cu ion or Ag ion in $Cu_{6-x}OS_5$. Even by this irradiation, electric charges in the storage cell units are maintained unchanged. Accordingly, an optical image corresponding to the object is detectable.

According to the foregoing embodiments, since the sheet-type storage cell units have positive electrode layers formed of a material capable of performing the optical intercalation, the light receiving amount in each of the storage cell units can be accurately read out as the amount of the electrical charges stored therein. Consequently, a solid image pick-up device having wide dynamic range and high image reproducibility can be provided. Further, a work can be externally made by the stored electrical charges if the charge is sufficiently high, and therefore, an image formation is achievable by the direct attraction of the toner particles to the each of the storage cell units. Furthermore, since the light receiving element and storage elements, i.e., the storage cell units 101 or 101' have simple constructions, productivity and yieldability can be enhanced, and large scale image pick-up device can be provided at relatively low cost.

In case of the latter embodiment, resolving power of resolution is determined by the wavelength of the applied light source, i.e., laser beam, by selecting short wavelength laser beam, a high density image reproduction is achievable, which has not been obtainable by CCDs. Moreover, since high density wiring which has been required in the CCD are not required in the solid image-pickup device using the storage cell units as described above, yieldability and productivity can be greatly enhanced in comparison with the CCDs.

A solid image pick-up device according to a third embodiment of this invention will be described with reference to FIGS. 12 through 15.

Figure 12:
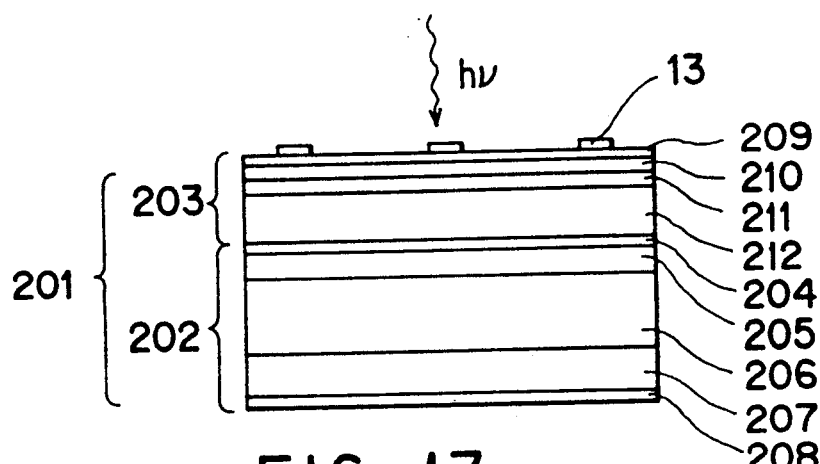
FIG. 12 shows a third embodiment of the solid image-pickup device according to this invention.
Figure 13:
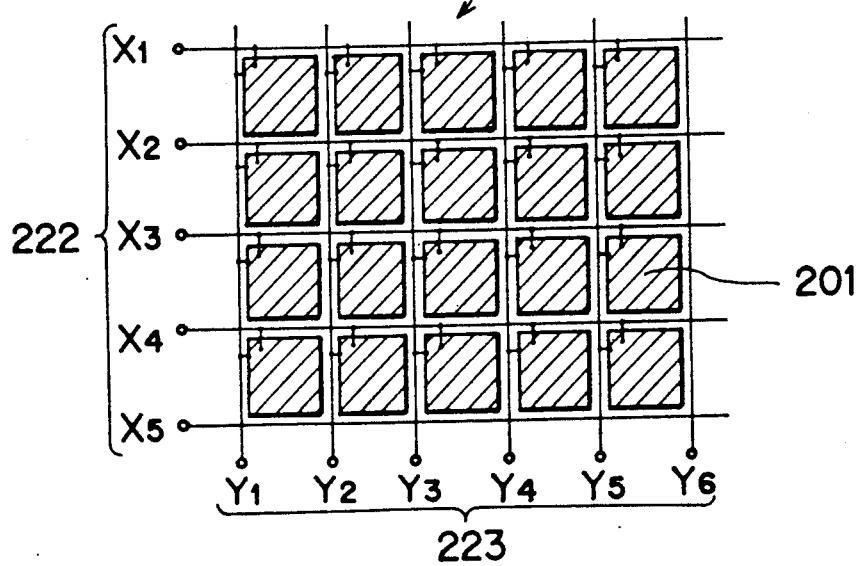
FIG. 13 shows a matrix arrangement of a number of solid image-pickup units constituting the solid image-pickup device of the third embodiment.

The solid image-pickup device of the third embodiment is closely concerned with the second embodiment and the modification thereof in terms of the positive electrode layer. The positive electrode layer of the modification of the second embodiment is used as both of a photoelectric conversion unit for converting an incident light image to a corresponding electric charge image and an electrode for optically reading out the electric charge image stored in a storage cell unit. However, unlike the modification, the positive electrode layer of the third embodiment is not used as a photoelectric conversion unit, but is used as only an electrode for optically reading out the electric charge image. The photoelectric conversion unit 203 of the third embodiment comprises, for example, a p-i-n type photoelectric transducer as shown in FIG. 12. The p-i-n type photoelectric transducer is provided on a storage cell unit 202, and a combination of both units constitutes a solid image-pickup units 201 of this embodiment. A plurality of solid image-pickup units 201 are arranged in a matrix form as shown in FIG. 13 to constitute a solid image-pickup device of this embodiment.

More specifically, the solid image-pickup unit 201 according to this embodiment has a sheet-type storage cell unit 202 and a photoelectric conversion unit 203 provided thereover. The sheet-type storage cell unit 202 includes a negative electrode collector 204, a negative electrode 205 formed of Li-Al alloy and provided immediately below the negative electrode collector 204, a solid electrolyte layer 206 formed of LiBr-Li$_8$P$_4$O and provided immediately below the negative electrode 205, a positive electrode layer 207 formed of V$_2$O$_5$ or V$_6$O$_{13}$ and provided immediately below the electrolyte layer 206, and a negative electrode collector 208 formed of Ni and provided immediately below the positive electrode layer 207. The negative and positive electrode collectors 204 and 208 are positioned at one and another side of the storage cell unit 202, respectively. The positive electrode layer 207 comprises a material having an optical intercalation function and a light absorbing characteristic variable in accordance with the change between charging and discharging states of the storage cell unit. On the positive electrode collector 204 is provided the photoelectrical conversion unit 203 which includes a surface electrode 213 formed of aluminum, an antireflection layer 209 formed of SiO$_2$ provided immediately below the surface electrode 213, a p-type silicon layer 210, an i-type silicon layer 211 and an n-type silicon layer 212. The latter silicon layer 212 is positioned directly on the negative electrode collector 204. Each of the solid image-pickup units 201 are arrayed in a two-dimensional form or a matrix form as shown in FIG. 13. As shown in FIG. 13, two groups of outgoing electrodes 222 and 223 are vertically and horizontally provided to the solid image-pickup device 221.

Upon irradiation of light having wavelength of hν onto each of the solid image-pickup units 201, an electrical energy is generated in each of the units in accordance with an incident light amount thereto, and the energy is stored in each of the sheet-type storage cell units 202, to thereby form and store an optical latent image therein.

Figure 14:
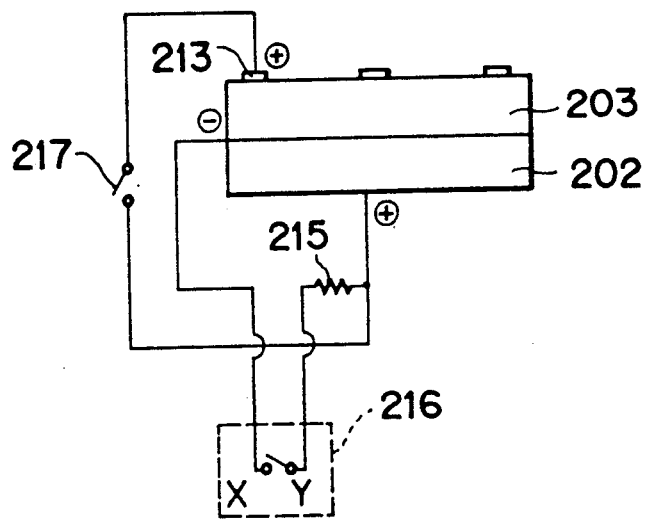
FIG. 14 shows charging and discharging circuits for the solid image pickup device as shown in FIG. 12.

FIG. 14 shows charging/discharging circuits for charging the sheet-type storage cell units upon light irradiation and for discharging charges stored in the storage cell units. At the time of light irradiation, a switch 217 serving as the charging circuit is turned on, while a switch 216 is turned off. Further, both of the switches 216 and 217 are turned off to hold an electric charge signal (after charging and before discharging). On the other hand, in order to discharge or erase the electric charge signal stored in the storage cell units 202, the switch 216 is turned on whereas the switch 217 is turned off. The switch 216 may be a shift resistor which is operated by a matrix scanning in both X and Y directions with reference to FIG. 1.

Figure 15A:
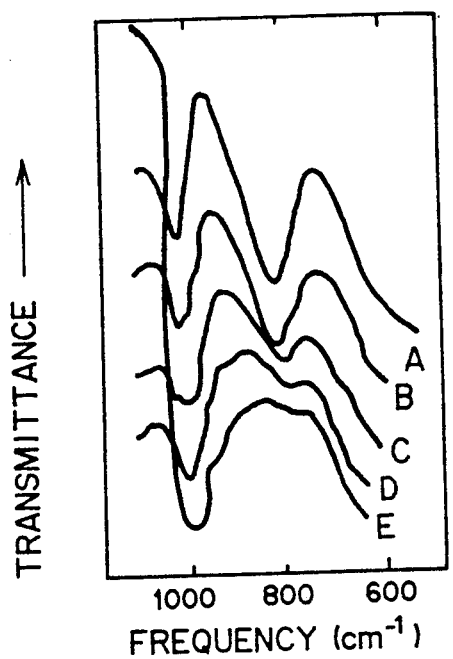
FIGS. 15(A) and 15(B) show infrared spectra of positive electrode layers having different compositions.
Figure 15B:
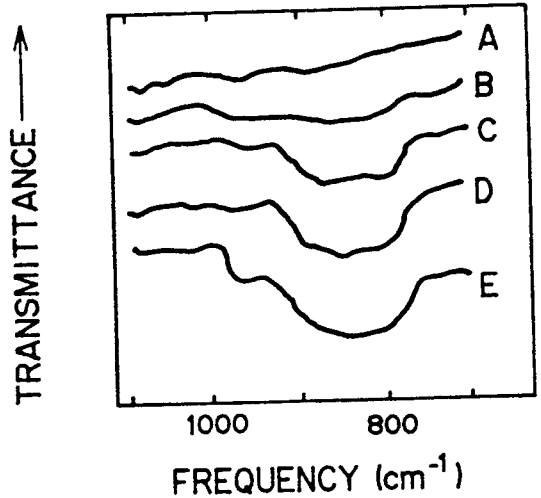

FIGS. 15(A) and 15(B) are graphical representations showing difference in light absorbing characteristic of the positive electrode layer between charging and discharging states of the storage cell units. These graphs show infrared spectrum of Li$_x$V$_2$O$_5$, and in which abscissa and ordinate represent frequency and transmittance. Here, if the positive electrode layer 207 and the negative electrode 205 of the sheet-type storage cell unit 202 are formed of vanadium oxide group and lithium, respectively, deintercalation of the lithium ion occurs in the vanadium oxide during charging of the storage cell units. More specifically, if the positive electrode layer 207 is formed of V$_2$O$_5$, as shown in FIG. 15(A), infrared spectrum is largely changed at frequencies ranging from 1,000 to 1,020 (an absorption peak) due to deintercalation of lithium. On the other hand, if the positive electrode layer 207 is formed of V$_2$O$_7$, the spectrum is greatly changed at frequencies ranging from 800 to 900 which is a peak of absorption.

By monitoring such a change in light absorbing characteristic, an amount of light incident to each storage cell unit can be detected. In this case, a monitoring device having the same arrangement as that shown in FIG. 11 can be used. In this case, a laser beam for optically reading out the electric charge signal stored in the storage cell units is also supplied through the positive electrode collector 208 to the positive electrode layer 207. If V$_2$O$_5$ is used as a material of the positive electrode layer 207, the laser beam having wavelength of 11.0 to 12.5 μm to be supplied from the light source 231 is preferably used.

With this arrangement, if the light image from the object is irradiated onto the solid image-pickup device, each of the solid image-pickup units 201 stores therein an electric charge whose amount is proportional to the applied light amount, to thereby provide an optical latent image. thereafter, a light such as laser beam from the light source 31 is applied to the each of the positive electrode layers of the storage cell units 202 through the polygon mirror with a scanning operation, and lights reflected from the positive electrode layers 208 are detected by the detector. In this case, since an amount of lithium ion in the vanadium oxide is changed in accordance with the charging amount of each of the storage cell units 202, spectral intensity of the light reflected from the storage cell unit 202 is also changed. Therefore, the detector can detect signals indicative of the optical latent image of the object.

In the third embodiment, the storage cell unit has a particular positive electrode whose light absorbing characteristic at the time of charging is different from that at the time of discharging, and a signal indicative of the optical latent image is read out upon detection of the light reflected from the positive electrode layers using the optical system shown in FIG. 11. Therefore, an electrical charge image stored in the storage cell units can be read out by detecting a change distribution in the light absorbing characteristic.

The solid image-pickup devices of the first to third embodiments as described above are used particularly to convert an incident light image into a corresponding electric charge image, and then electrically or optically read out the electric charge image as an image information. This image information is subjected to various processings for reproducing an original image. That is, the solid image-pick devices are used for an imaging process. In the following embodiments, the solid image-pickup device according to this invention is applied to a copying machine in which a latent image is formed on the basis of an original image, and then is developed into a visible image with toners. That is, in addition to the imaging process, the solid image-pickup device according to this invention can be used for a copying process.

A solid image pick-up device according to a fourth embodiment will be described hereunder with reference to FIGS. 16 through 22. The fourth embodiment employs a plurality of solid image-pickup units identical with those employed in the first embodiment as show in FIG. 1, and therefore the same elements as those of FIG. 1 are represented by the same reference numerals and the description of the construction of each solid image-pickup unit is eliminated.

In the fourth embodiment, a glass plate 31 and an image-pickup portion including a toner developing electrode 323 and a thermistor switch 300 are provided in combination with the solid image pickup unit as shown in FIG. 1.

Figure 16:
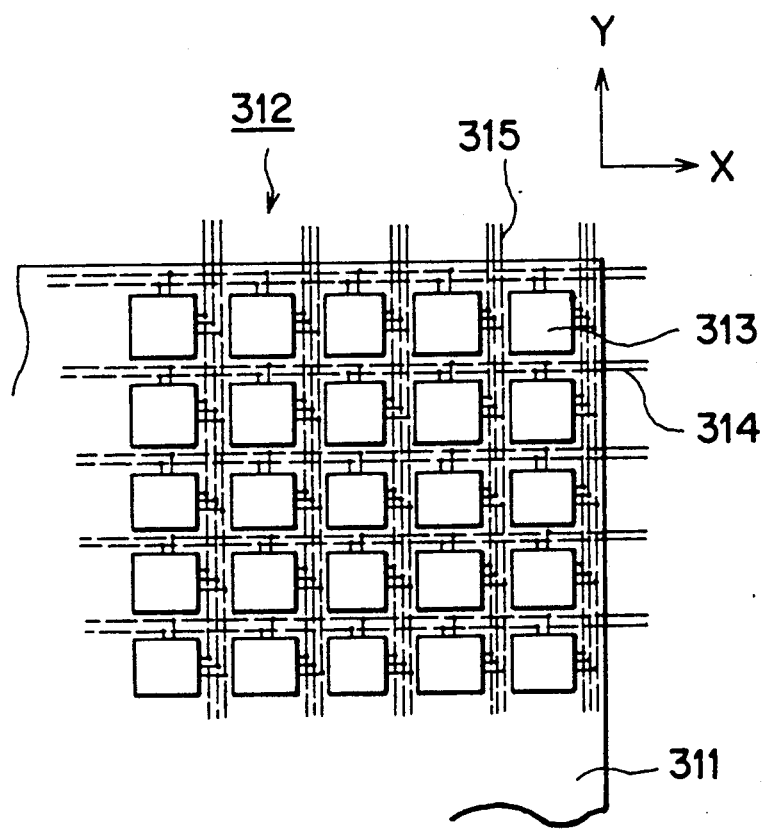
FIG. 16 is a top view of a fourth embodiment of the solid image-pickup device.
Figure 17:
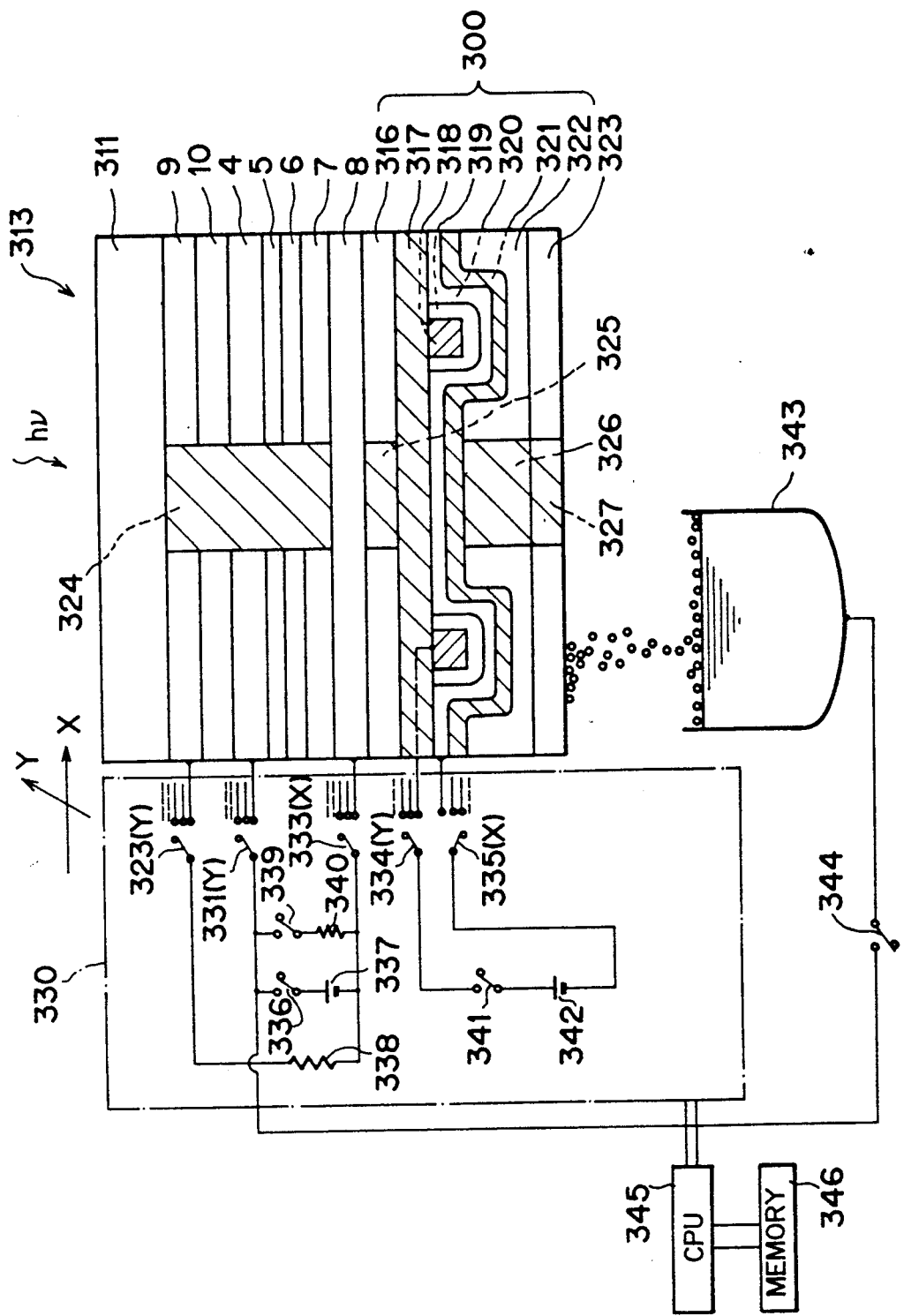
FIG. 17 is a cross-sectional view of the solid image-pickup device as shown in FIG. 16, and is an explanatory diagram for an electrical connection.

More specifically, as shown in FIGS. 16 and 17, the image-pickup device 312 of this embodiment has the glass substrate 311 provided at an uppermost portion thereof, and a plurality of solid image-pickup units 301 each of which is provided with a discharge switch 3 and a storage cell unit 2. The solid image-pickup device 312 further includes image-pickup portion 313 which is provided with the thermistor switch 300 and the toner developing electrode 323. The thermistor switch 300 is adapted for individually charging each of the storage cell units 2. The solid image-pickup device 312 has two groups of outgoing electrodes 314 in the horizontal direction (hereinafter referred to as X-direction groups) and three groups of outgoing electrodes 315 in the vertical direction (hereinafter referred to as Y-direction groups). One of the X-direction groups is connected to a negative electrode collector 308 of each storage cell unit 302 and the other is connected to a heat generating electrode 320 (as described below) of each thermistor switch 300. The Y-direction groups are connected to the discharge switch (transparent electrode 9), the positive electrode 4 and a heat generating electrode 318 of each solid image-pickup unit, respectively.

The construction of the solid image-pickup device of this embodiment will be described in detail.

As shown in FIG. 17, the storage cell unit 2 of the solid image-pickup unit 301 has the positive electrode collector 4, the positive electrode 5, the solid electrolyte layer 6, the negative electrode 7 and the negative electrode collector 8, those being the same as in the first embodiment. Further, at a lower surface of the negative electrode collector 8 are provided the thermistor switch 300 for individually and selectively changing a resistance value of each of the storage cell units 2, and the toner developing electrode 323 in contact with the lowermost surface of the thermistor switch 300. The thermistor switch 300 include a thermistor member 316, an insulation layer 317, Y-direction heat generating electrode 318, a heat generator 319, a X-direction heat generating electrode 320, a second insulation layer 321 and a second thermistor member 322.

Figure 18:
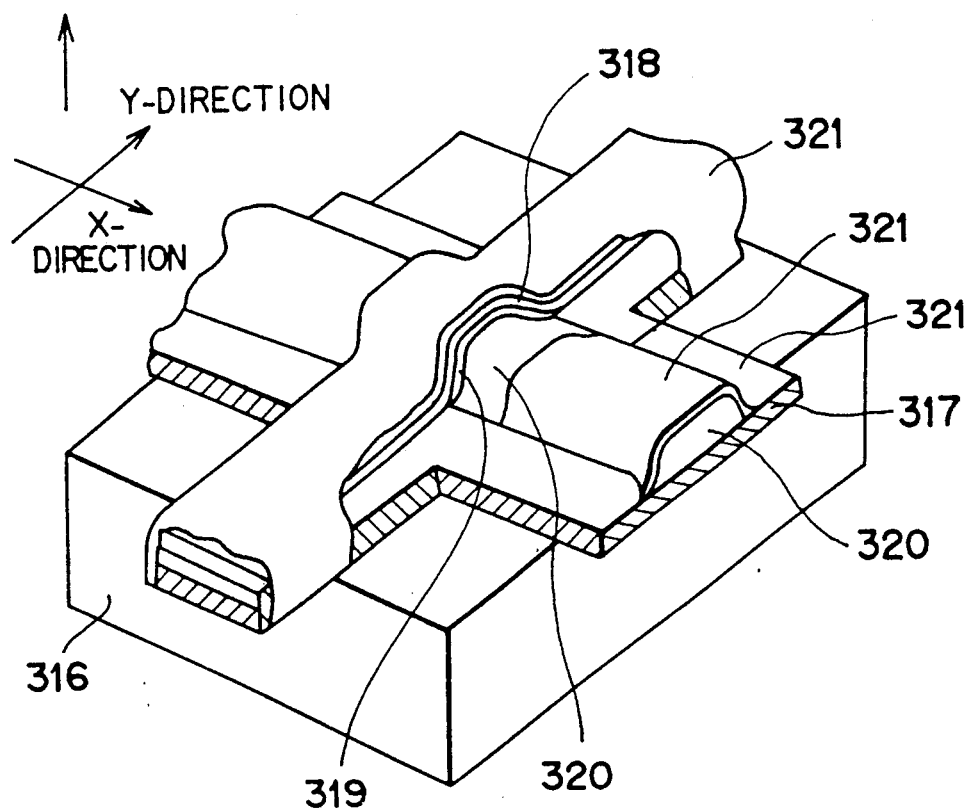
FIG. 18 is a schematic perspective view showing a thermistor switch for individually discharging storage cell units.

FIG. 18 shows the thermistor switch 300. The heat generator 319 for generating heat is provided at an intersecting portion between the X- and Y-direction heat generating electrodes 318 and 320, so that the resistance values of the thermistor members positioned adjacent the intersection is lowered with the heat generated by the heat generator 319. Further, an insulation resists 324 through 327 are provided as shown in FIG. 17. Profiles of all of the elements constituting the solid image-pickup unit as shown in FIG. 17 are shown in FIGS. 19(A) through 19(M).

Next, a wiring arrangement of the outgoing electrodes and an electrical circuit therefor will be described with reference to FIGS. 75 and 20.

A controller 330 is provided for performing a matrix scanning in X, Y directions for the outgoing electrodes. A shift register or the like may be used as a switching portion of the controller 330. In the controller 330, the positive electrode collector 4 and the transparent electrode 9 of the discharge switch 3 are connected to Y-direction switches 331 and 332, respectively. The negative electrode collector 8 is connected to an X-direction switch 333, the heat generating electrode 318 is connected to a Y-direction switch 334, and the heat generating electrode 320 is connected to an X- direction switch 335.

Further, a charging circuit is provided by a switch 336 and an external power source (constant current source) 337 for charging each storage cell unit 2 through the switches 331 and 333. Furthermore, a discharging circuit is provided by a resistor 338 having one end connected to the discharge switch 3 through the switch 332 and the other end connected to the negative electrode collector 8 through the switch 333, whereby the electrical charges stored in the storage cell units 2 can be discharged. Moreover, a measuring circuit is provided by a switch 339 and a resistor 340 so as to measure residual electrical charges in the storage cell units after the storage cell units are discharged, thereby read out the electric charge image stored in the storage cell units as a bit map information A switch 341 and an external power source 342 serving as a power supply circuit is provided to generate heat in the heat generator 319 through the switches 334 and 335.

In confrontation with the lowermost surface of the toner developing electrode 323, a toner spray 343 for accommodating toners and spraying the toners to the toner developing electrode 323 is provided, which is electrically connectable to the positive electrode collector 4 through spray 343 to the toner developing electrode 323 through a discharging operation of the storage cell units 2, and the electric charge image (optical latent image) on the toner developing electrode 323 can be developed with the toners Each of the switches 332-336, 339 and 341 provided in the controller 330 are controllable by a CPU 345 where data writing in the storage cell units and data reading out of the storage cell units are executed, and the measured data is stored in a memory 346.

Figure 20:
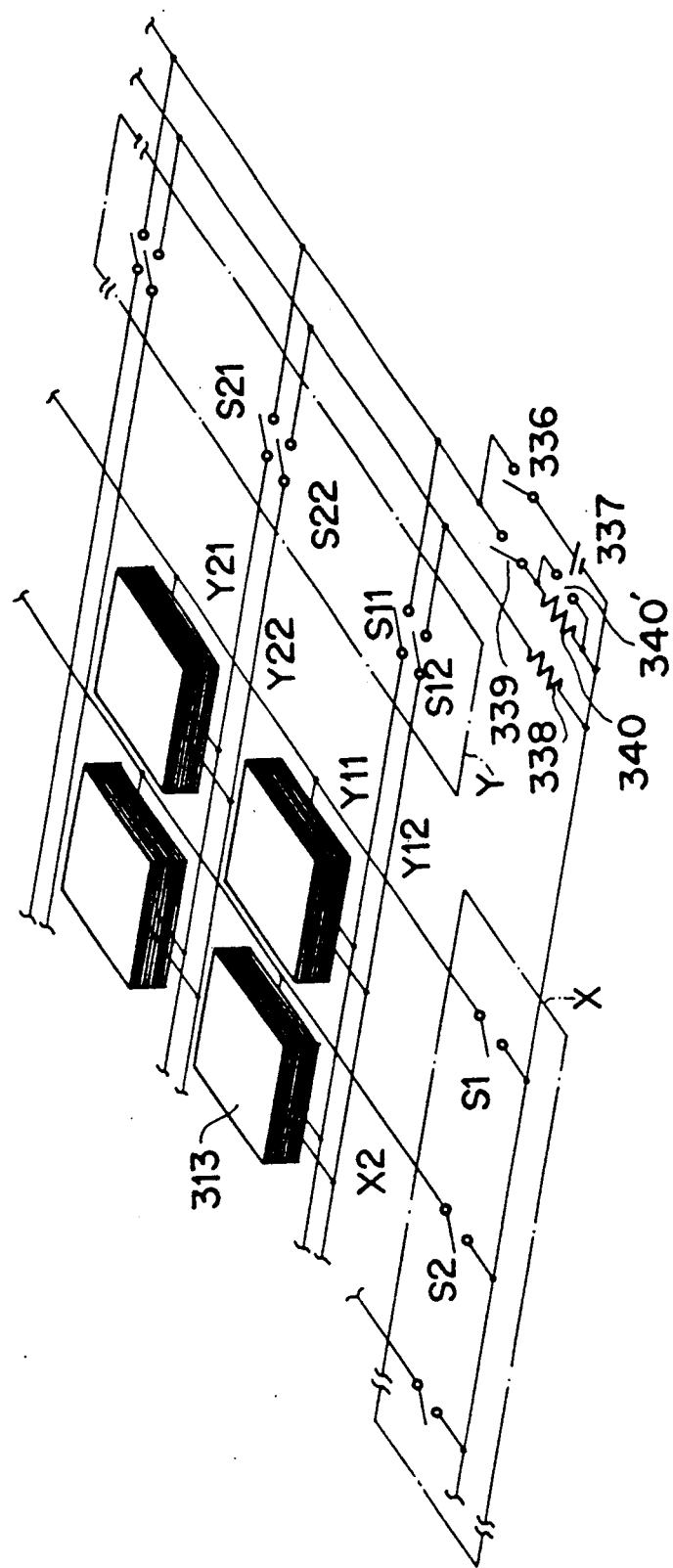
FIG. 20 is a schematic perspective view showing an wiring arrangement for the solid image-pickup device of the fourth embodiment.

As shown in FIG. 20, switches S1, S2 correspond to the switch 333, switch S11, S21 correspond to the switch 331, and switch S12, S22 correspond to the switch 332, respectively. Further, the measurement of the residual charges is performed by detecting a voltage occurring between both terminals 340' of the resistor 340 through the CPU 345.

Next, an operation of the fourth embodiment will be described.

The switch 336 is turned on for a predetermined period, and each of the switches 331 and 333 is successively switched, so that predetermined amount of electrical current flows from the external source 337 into the sheet-type storage cell units 2, to thereby charge the storage cell units 2. Then, the switches 332 and 333 are turned on. When a light hv is applied onto the discharge switch 3, the switch 3 becomes electrically conductive (turned on) because of the photoconductive property of the photoconductive layer 10. Therefore, the electrical charges stored in the storage cell units 2 are discharged through the photoconductive layer 10 and the electrode 9. In this case, the discharge amount being proportional to the intensity of light and an irradiating period of the light. As a result, residual electrical charges in each of the storage cell units 2 are different from one another and a charge distribution occurs in the storage cell units. This charge distribution corresponds to an optical latent image of the incident light image.

Thereafter, the switch 339 is turned on while the switches 331 and 333 are successively switched so as to read out the optical latent image as a bit map information. Therefore, residual charge amount can be read out as a bit map informations through the resistor 340. The bit map information is stored in the memory 346. If this information is two-dimensionally plotted, the original image can be traced.

Next, in accordance with the bit map information, electrical charge whose amount is equivalent to the electrical discharge amount (initial charging amount by the power source 337 minus residual charge amount) is again supplied to the respective storage cell units 2 from the power source 337. As a result, a latent image is again provided in the solid image-pickup device. Then, switches 334 and 335 are turned on so that an electrical current is applied to the heat generator 319 for its selective heat generation, to thereby heat the thermistors 316 and 322 and lower resistance values of these thermistors. As a result, negative charges are selectively applied to the developing electrode 323. If the switches 344 is turned on, toner particles in the toner spray 343 are electrically attracted onto the developing electrode 323 by electrophoresis and electrodeposition, to perform toner developing. If a transfer sheet (not shown) is supplied and is superposed with the developing electrode 323, a toner image corresponding to the optical latent image stored in the solid image-pickup device is transferred onto the sheet to perform a copying process.

In the fourth embodiment, a photoconductive material is used for the layer 10 so as to constitute the discharge switch 3. However, instead of the discharge switch 3, a p-i-n type photoelectric transducer as shown in FIG. 12 is also available as a photoelectric conversion unit. In this case, electrical energy generated in the photoelectric conversion unit upon light irradiation is stored as charges in the storage cell unit, and the charge amount is measured for taking the bit map information.

Figure 21:
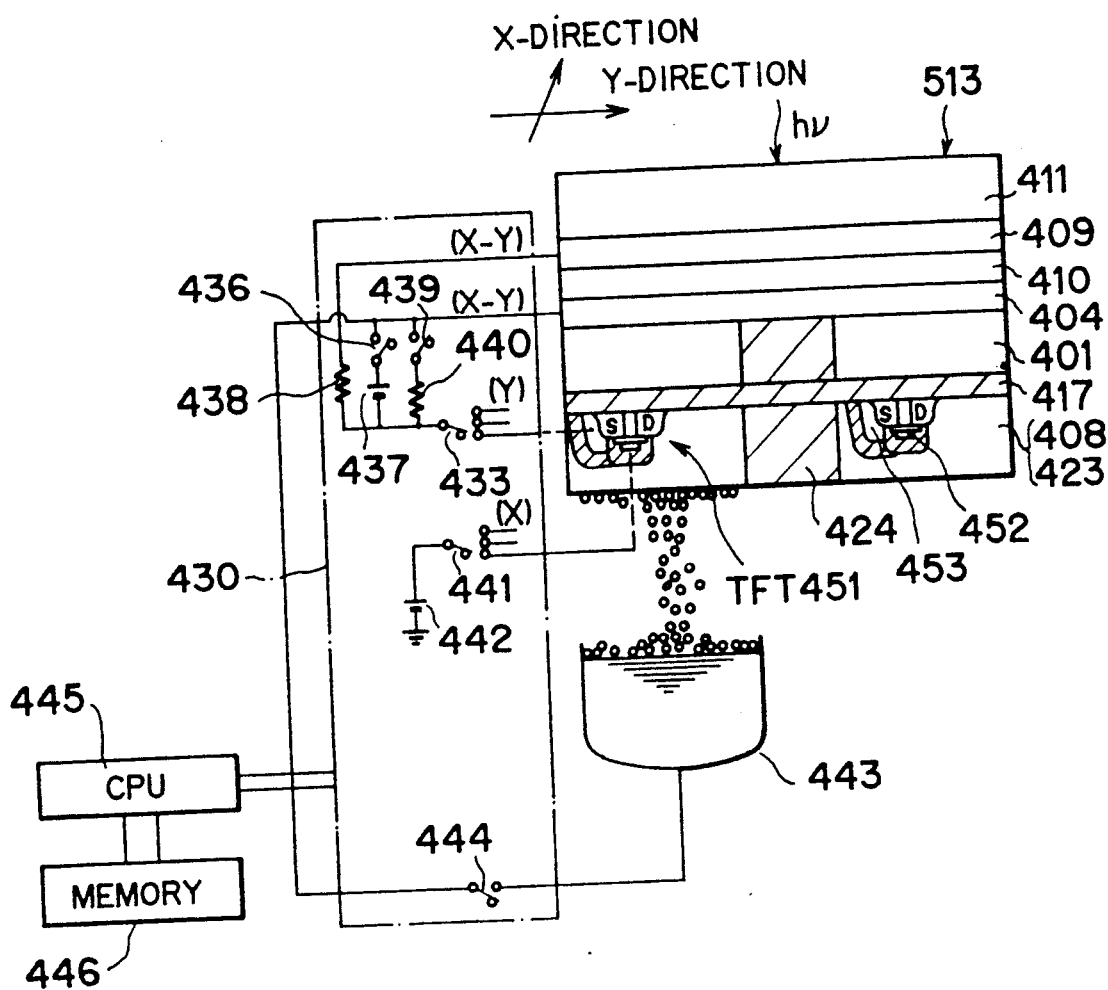
FIG. 21 is a cross-sectional view of a modification of the solid image-pickup device of the fourth embodiment and an associated electrical circuit therefor.
Figure 22:
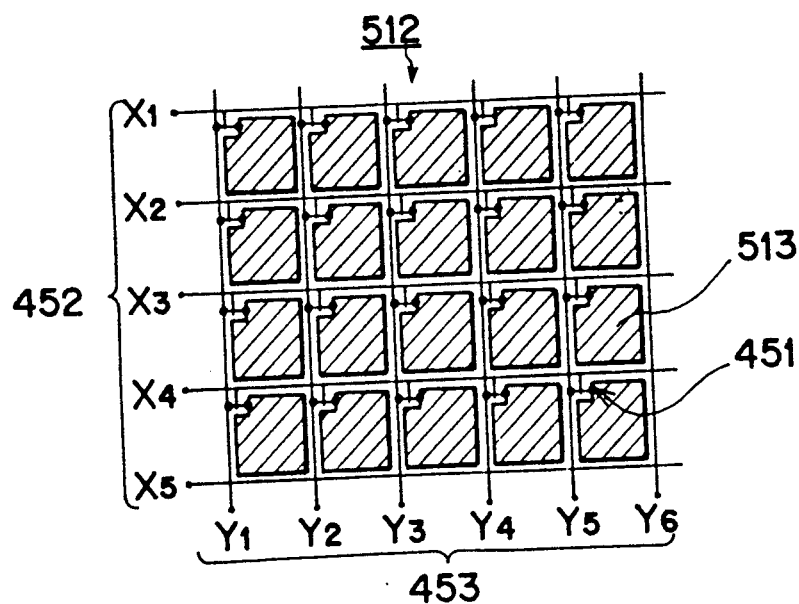
FIG. 22 is a plan view showing the solid image-pickup device as shown in FIG. 21.

FIG. 21 shows a modification of the solid image-pickup device as shown in FIG. 17, and FIG. 22 is a top view of the solid image-pickup device as shown in FIG. 21.

The solid image-pickup device of this modification has the substantially same construction as that of FIG. 17, except for the thermistor switch. In place of the thermistor switch, each of solid image-pickup units of this modification has a switch such as a MOS-type (metal-oxide-semiconductor) transistor, for example, TFT (thin film transistor) is used. As shown in FIG. 22, the solid image-pickup device 512 of this modification includes a plurality of solid image-pickup units 513 each comprising a discharge switch 403, a storage cell unit 402 and a TFT switch 451. The solid image-pickup device 512 also includes a signal electrode 453 and a gate electrode 452.

As shown in FIG. 21, the TFT switch 451 is embedded in the negative electrode collector 408, and a lower surface of the negative electrode collector 408 serves as a toner developing electrode 423. source S, gate G and drain D of each TFT 451 are connected to the negative electrode collector 408, an outgoing electrode for each gate electrode 452 and the toner developing electrode 423, respectively. The signal electrode 452 is connected to a switch 433 which is equivalent to the switch 333 in the fourth embodiment) and is driven with a matrix scanning operation. Further, the gate electrode 452 is connected to a power source 442 through a switch 441 for individually controlling each TFT 451. In view of this point, the structure of these elements is regarded as being equivalent to the switches 334, 335, 341 and the power source 342 those for individually controlling the thermistor switches in the fourth embodiment.

In this modified solid image-pickup device, similar to the fourth embodiment, when the light hν is irradiated, the charges in the storage cell units are discharged through the discharge switch 403 which has the photoconductive layer 410. As a result, an optical latent image is formed over the image-pickup units of the solid image-pickup device 512. Thereafter, by allowing the switch 441 to conduct the matrix scanning operation, the TFTs 451 are sequentially and individually allowed to be conductive, so that residual charges in the storage cell units can be sequentially and individually discharged through the switches 444 and the toner spray 443. Consequently, toner particles are attracted and deposited on the toner developing electrodes 423 in accordance with the electric charge image stored in the storage cell units.

In the fourth embodiment and the modification thereof, operation of the toner developing electrode 423 is successively switched by using the thermistor switch or the MOS-type transistor. Therefore, toner transfer is carried out every picture element. However, an entire dipping method in which toners are supplied to the toner developing electrodes at one time may be used.

In the above embodiments, a bit map information can be used for reproducing a latent image in the solid image-pickup device with or without editorial modification thereto. Therefore, an optical latent image formed by a single light exposure can be directly developed, and exposure and developing units can be simplified in construction. Further, storage cell units can be discharged independent of each other by using the thermistor switch or MOS-type transistor switch, and therefore a developing system does not undergo severe restrictions.

While the invention has been described in detail and with reference to specific embodiments thereof, it would be apparent to those skilled in the art that various changes and modifications can be made therein without departing from the spirit and scope of the invention.

What is claimed is:

1. A solid image-pickup device for converting an optical image of an object into a corresponding electric charge image and reproducing the image on the basis of the corresponding electrical charge image, comprising:
imaging means having a number of photoelectric conversion units each having a light receiving surface for converting an optical image of an object incident thereto into an electrical signal representing a light amount of the incident optical image, and a number of storage cell units each comprising a positive electrode, a solid electrolyte and a negative electrode and each storing charges in accordance with the electrical signal, wherein each of said photoelectric conversion units is laminated on one of said positive and negative electrodes, to thereby form and store therein an electric charge image corresponding to the optical image, said photoelectric conversion units and said storage cell units being arranged in a matrix form and each of said photoelectric conversion units being laminate on each of said storage cell units; and charge image detecting means for optically or electrically reading out the electrical charge signal stored in said solid image-pickup device to reproduce the optical image.

2. A solid image-pickup device as claimed in claim 1, wherein each of said photoelectric conversion units comprises a photoswitch having a transparent electrode and a photoconductive layer.

3. A solid image-pickup device as claimed in claim 2, wherein said imaging means further comprises a charging unit for charging each of said storage cell units at a predetermined value, said photoswitch discharging the amount of charges corresponding to the amount of the incident optical image therethrough from said storage cell units to thereby form the optical latent image with charges remaining in said storage cell elements.

4. A solid image-pickup device as claimed in claim 3, wherein said charging unit comprises a power source and a switch for successively supplying charges to each of said storage cell units through said power source.

5. A solid image-pickup device as claimed in claim 1, wherein said photoelectric conversion unit comprises a layer formed of a material having an optical intercalation function, said layer serving as a positive electrode of each of said storage cell units.

6. A solid image-pickup device as claimed in claim 5, wherein said material has different light absorbing characteristics between charging and discharging states of said storage the electric charge image being stored as a change distribution in the light absorbing characteristic of said positive electrodes of said storage cell units.

7. A solid image-pickup device as claimed in claim 6, wherein said charge image detecting means comprises a light source for irradiating light to said positive electrodes of said storage cell units, and a detector for detecting lights reflected from said positive electrodes thereby detect the change distribution in the light absorbing characteristic and thus detect the electric charge image stored in said storage cell units.

8. A solid image-pickup device as claimed in claim 1, wherein each of said photoelectric conversion units comprises a p-i-n photoelectric transducer including a surface electrode, a p-type semiconductor layer, an i-type semiconductor layer and an n-type semiconductor layer laminated in this order, each of said storage cell units storing charges produced in said p-i-n photoelectric transducer.

9. A solid image-pickup device as claimed in claim 1, wherein said positive electrode has an optical intercalation function.

10. A solid image-pickup device as claimed in claim 1, further comprising a developing electrode provided at the opposite surfaces of said storage cell units to said photoelectric conversion units, and a switching unit provided between said developing electrode and said storage cell units for selectively passing therethrough charges stored in each of said storage cell units to said developing electrode, so that the charges stored in said storage cell units are dischargeable through said developing electrode.

11. A solid image-pickup device as claimed in claim 10, wherein said switching unit comprises a thermistor layer variable in resistance thereof.

12. A solid image-pickup device as claimed in claim 11, wherein each of said photoelectric conversion units comprises a photoswitch having a transparent electrode and a photoconductive layer.

13. A solid image-pickup device as claimed in claim 12, wherein said imaging means further comprises a charging unit for charging each of said storage cell units at a predetermined value, said photoswitch discharging the amount of charges corresponding to the amount of the incident optical image therethrough from said storage cell units to thereby form the optical latent image with charges remaining in said storage cell elements.

14. A solid image-pickup device as claimed in claim 10, wherein said switching unit comprises a MOS-type transistor.

15. A solid image-pickup device as claimed in claim 14, wherein each of said photoelectric conversion units comprises a p-i-n photoelectric transducer including a surface electrode, a p-type semiconductor layer, an i-type semiconductor layer and an n-type semiconductor layer laminated in this order, each of said storage cell units storing charges produced in said p-i-n photoelectric transducer.

16. A solid image-pickup device as claimed in claim 10, further comprising a toner spray gun for electrically supplying toners to the developing electrode of through a discharging operation of said storage cell units to thereby develop the electric charge image on said developing electrode with the toners into a toner image.

* * * * *